United States Patent
Kim (10) Patent No.: US 8,186,299 B2
(45) Date of Patent: May 29, 2012

(54) EVAPORATION APPARATUS AND THIN FILM FORMING METHOD USING THE SAME

(75) Inventor: Gong-Min Kim, Suwon-si (KR)

(73) Assignee: Samsung Mobile Display Co., Ltd., Giheung-Gu, Yongin, Gyunggi-Do (KR)

(*) Notice: Subject to any disclaimer, the term of this patent is extended or adjusted under 35 U.S.C. 154(b) by 644 days.

(21) Appl. No.: 12/314,991

(22) Filed: Dec. 19, 2008

(65) Prior Publication Data
US 2009/0220691 A1 Sep. 3, 2009

(30) Foreign Application Priority Data

Feb. 28, 2008 (KR) .................... 10-2008-0018529

(51) Int. Cl.
*C23C 16/00* (2006.01)
(52) U.S. Cl. ............. 118/427; 118/426; 427/248.1
(58) Field of Classification Search ........... 427/248.1; 118/726, 727
See application file for complete search history.

(56) References Cited

U.S. PATENT DOCUMENTS

| | | | | |
|---|---|---|---|---|
| 2004/0031442 A1* | 2/2004 | Yamazaki et al. | ........... | 118/727 |
| 2007/0178708 A1 | 8/2007 | Ukigaya | | |
| 2009/0232976 A1* | 9/2009 | Yoon et al. | ........... | 427/157 |

FOREIGN PATENT DOCUMENTS

| JP | 2001247959 A | 9/2001 |
|---|---|---|
| JP | 2004111386 A | 4/2004 |
| JP | 2004-238663 | 8/2004 |
| JP | 2007-227359 | 9/2007 |
| JP | 2007-227359 A | 9/2007 |
| JP | 2007227359 A | 9/2007 |
| KR | 10-2004-0007811 | 1/2004 |
| KR | 1020060018745 A | 3/2006 |

OTHER PUBLICATIONS

Machine translation of JP 2007-227359, Nobutaka Ukigaya, Vapor Deposition Device and Deposition Method, Jun. 9, 2007.*
Korean Office Action dated Nov. 27, 2009, corresponding to Korean Patent Application No. 10-2008-0018529.
Korean Registration Determination Certificate issued by Korean Patent Office on May 10, 2010 corresponding Korean Patent Application No. 10-2008-0018529 and Request for Entry of the Accompanying Document attached herewith.
Japanese Office action issued by Japanese Patent Office on Nov. 29, 2011, corresponding to Japanese Patent Application No. 2009-022715 and Request for Entry attached herewith.

* cited by examiner

*Primary Examiner* — Queenie Dehghan
(74) *Attorney, Agent, or Firm* — Robert E. Bushnell, Esq.

(57) ABSTRACT

Provided are an evaporation apparatus and a thin film forming method using the same. The evaporation apparatus and the thin film forming method are used to form a uniform thin film, even for a large substrate, and can be easily employed without changing equipment even if a substrate size is changed. The evaporation apparatus includes a first evaporation source, a second evaporation source separated from the first evaporation source, and a compensation member disposed between a target object and the first and second evaporation sources. The compensation member performs a linear movement simultaneously with the first and second evaporation sources. The compensation member includes a first compensation plate disposed in a position corresponding to the first evaporation source, and a second compensation plate disposed in a position corresponding to the second evaporation source.

10 Claims, 5 Drawing Sheets

EVAPORATION APPARATUS AND THIN FILM FORMING METHOD USING THE SAME

CLAIM OF PRIORITY

This application makes reference to, incorporates the same herein, and claims all benefits accruing under 35 U.S.C. §119 from an application for EVAPORATION APPARATUS AND THIN FILM FORMING METHOD USING THE SAME earlier filed in the Korean Intellectual Property Office on the 28 of Feb. 2008 and there duly assigned Serial No. 10-2008-0018529.

BACKGROUND OF THE INVENTION

1. Field of the Invention

The present invention relates to an evaporation apparatus and a thin film forming method using the same, and more particularly, to an evaporation apparatus and a thin film forming method using the same which can increase a thickness uniformity of a thin film even when a target object is large.

2. Description of the Related Art

In a flat panel display such as an organic light emitting display (OLED), an organic material or a metal used for an electrode is formed as thin films on a flat panel by evaporating a corresponding material in a vacuum atmosphere.

In such a thin film formation, a thickness uniformity of the thin film greatly affects the features of the flat panel display, such as effective dispersion and color coordinate dispersion. Thus, research has been conducted in order to increase the thickness uniformity of thin films when evaporation is performed.

For example, according to an evaporation apparatus disclosed in Korean Patent Laid-Open Publication No. 2004-0007811, entitled "A vacuum evaporation apparatus and design method of shield member for the vacuum evaporation apparatus", the evaporation apparatus includes a shield member for making the thickness of the thin film uniform and which is located between a substrate and an evaporation source heating and evaporating an evaporation material. However, the disclosed evaporation apparatus is intended for small substrates, and thus, it is difficult to apply the disclosed evaporation apparatus to large substrates.

Japanese Patent Laid-Open Publication No. 2004-238663, entitled "Evaporation apparatus" discloses an evaporation apparatus which attempts to efficiently control a dispersion angle of an evaporation material and to optimize a film thickness distribution. This evaporation apparatus can easily perform evaporation in a large-area substrate by using a linear evaporation source, and includes a shielding element in the linear evaporation source, wherein the shielding element is for shielding the evaporation material. However, this particular evaporation apparatus can only be applied to a fixed evaporation source and has to match a size of a substrate.

SUMMARY OF THE INVENTION

The present invention provides an evaporation apparatus and a thin film forming method using the same, which can be used to form a uniform thin film for different sizes of substrates.

According to an aspect of the present invention, there is provided an evaporation apparatus, including a first evaporation source, a second evaporation source being separated from the first evaporation source, a compensation member disposed in a space defined by a target object and the first and second evaporation sources. The first and second evaporation sources simultaneously move in a moving direction, and the compensation member moves in the moving direction simultaneously with the first and second evaporation sources. The compensation member includes a first compensation plate disposed in a position closer to the first evaporation source than the second evaporation source, and a second compensation plate disposed in a position closer to the second evaporation source than the first evaporation source.

The compensation member may further include a support unit connecting the first compensation plate to the second compensation plate.

The first compensation plate and the second compensation plate may protrude beyond the support unit toward the first evaporation source and the second evaporation source, respectively. The first compensation plate and the second compensation plate may protrude beyond the support unit so as to be respectively parallel to the first evaporation source and the second evaporation source.

The compensation member may be located at a side of the moving direction with respect to the first and second evaporation sources. The first evaporation source and the second evaporation source may perform a reciprocating linear movement. The compensation member may be located at a side opposite to the moving direction with respect to the first and second evaporation sources.

The second evaporation source may be separated from the first evaporation source in a direction substantially perpendicular to the moving direction.

According to another aspect of the present invention, there is provided a thin film forming method, including the operations arranging at least two evaporation sources which are separated from each other, placing a target object to face the at least two evaporation sources, shielding a first space formed between the target object and one of the at least two evaporation sources, shielding a second space formed between the target object and another of the at least two evaporation sources, and forming a thin film on the target object while simultaneously moving the at least two evaporation sources in a moving direction. The first space is closer to the one of the at least two evaporation sources, and the second space is closer to the another of the at least two evaporation sources.

An amount of evaporation material shielded in the first and second spaces is greater than an amount of evaporation material shielded in a position corresponding to a distance between each of the at least two evaporation sources.

The step of shielding the first space may include a step of placing a first compensation plate in the first space, and the step of shielding the second space may include a step of placing a second compensation plate in the second space. The step of forming the thin film may include a step of forming a thin film on the target object while reciprocating the at least two evaporation sources simultaneously with the first and second compensation plates.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
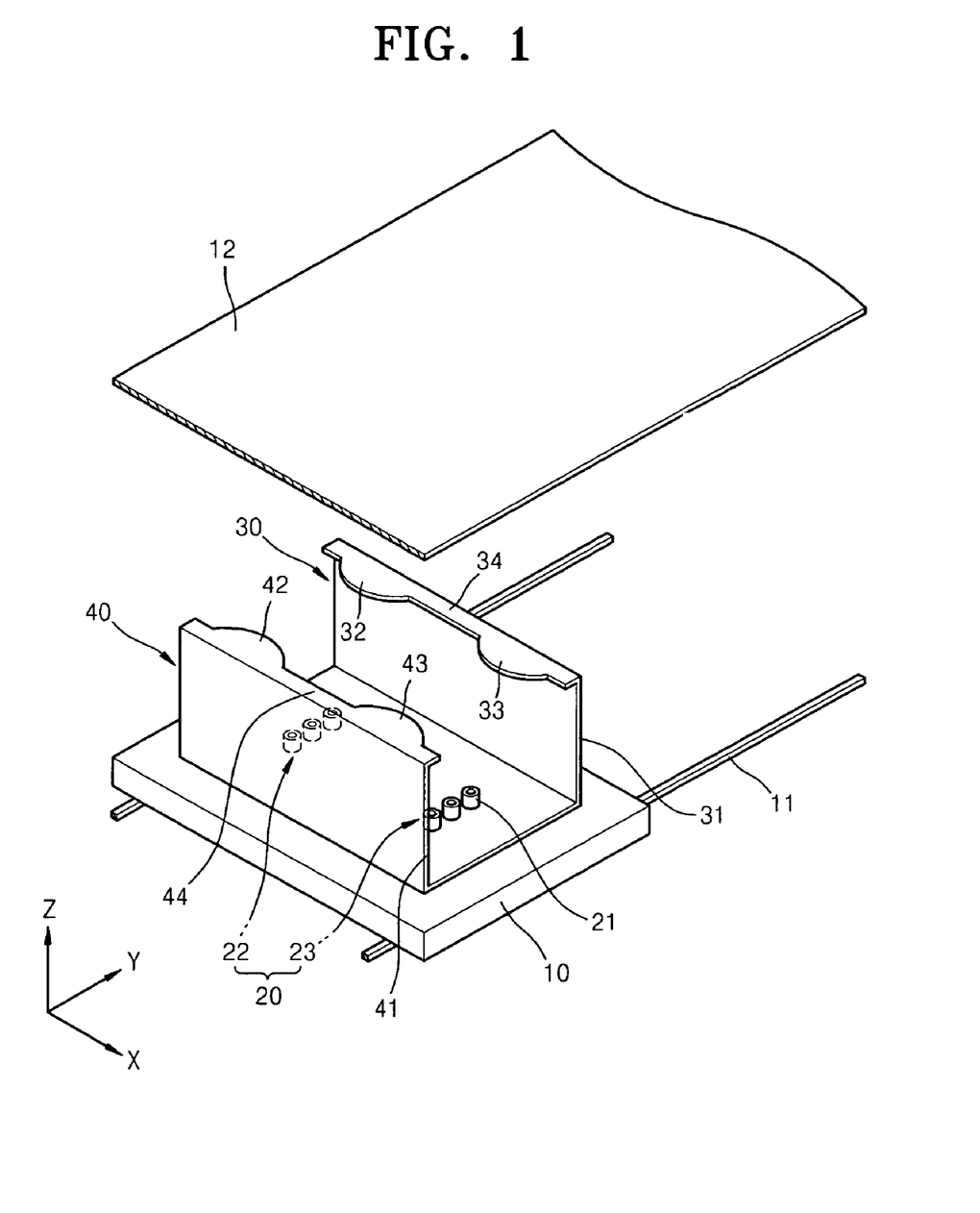
FIG. 1 is a perspective view of an evaporation apparatus according to an embodiment of the present invention.

FIG. 1 is a perspective view of an evaporation apparatus constructed as an embodiment of the present invention. Although a chamber is not illustrated in FIG. 1 for convenience of description, all components illustrated in FIG. 1 may be arranged in a chamber in which an appropriate vacuum is maintained.

In a chamber, a substrate 12, on which a thin film is to be formed, is disposed. The substrate 12 may be for a flat panel display. The substrate 12 may be a larger area substrate such as a mother glass used to form a plurality of flat panel displays.

Referring to FIG. 1, a plurality of evaporation sources 20 is disposed on an upper surface of a base 10 facing the substrate 12. That is, referring to FIG. 1, the evaporation sources 20 are disposed on the base 10 which faces the substrate 12 but is separated from the substrate 12 in a Z-axis direction. The base 10 is arranged so as to be installed on guide rails 11 extending in a Y-axis direction in the chamber, and to perform a reciprocating movement in the Y-axis direction along the guide rails 11. Thus, the base 10 is connected to a separate driving unit (not shown), and is driven.

The evaporation sources 20 include a first evaporation source 22 and a second evaporation source 23. As illustrated in FIG. 1, the first evaporation source 22 and the second evaporation source 23 are arranged so as to be separated from each other by a predetermined distance, and to simultaneously move in the same direction (the Y-axis direction). Also, each of the first and second evaporation sources 22 and 23 may include a plurality of evaporation crucibles 21. The evaporation crucibles 21 in each of the first and second evaporation sources 22 and 23 may be rectilinearly aligned in the same direction (the Y-axis direction). However, the present invention is not limited thereto, that is, the evaporation crucibles 21 may be arranged randomly in the first and second evaporation sources 22 and 23. The evaporation crucibles 21 may be linear crucibles extending in the Y-axis direction.

In the current embodiment, the evaporation sources 20 have been described as including two evaporation sources, that is, the first evaporation source 22 and the second evaporation source 23. However, the present invention is not limited thereto, and the evaporation sources 20 may include more than two evaporation sources. In such a case, a shape of a compensation member to be described later has to be arranged so as to correspond to this structure.

Figure 5:
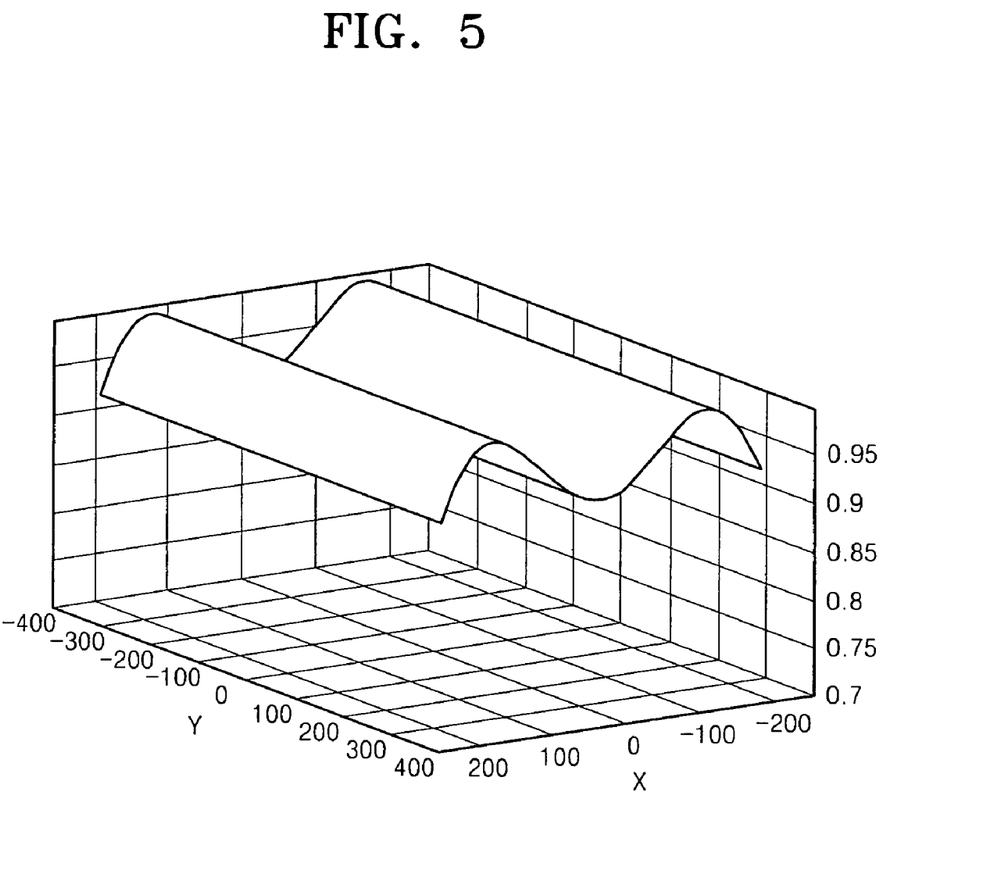
FIG. 5 is a diagram of a thin film profile formed without using the compensation members in the evaporation apparatus of FIG. 1.

When a thin film is formed via an evaporation using the evaporation sources 20 with the aforementioned structure as illustrated in FIG. 1, the formed thin film has a profile as illustrated in FIG. 5.

In this case, as illustrated in FIG. 5, non-uniformity of film thickness occurs. That is, portions of the thin film directly facing the evaporation sources 20 are considerably thicker than portions of the thin film located between the first and second evaporation sources 22 and 23.

Figure 2:
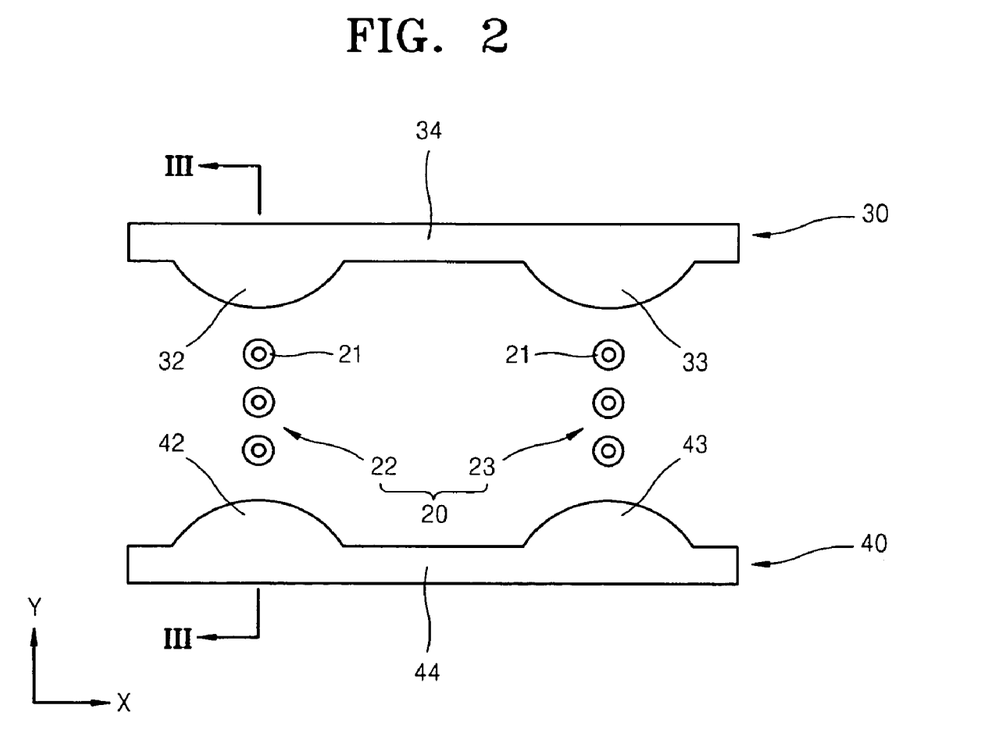
FIG. 2 is a plan view of evaporations sources and compensation members in the evaporations apparatus of FIG. 1, according to an embodiment of the present invention.

In order to prevent the film non-uniformity, the evaporation apparatus of the current embodiment of the present invention includes a first compensation member 30 and a second compensation member 40, which have structures illustrated in FIG. 2, and which are disposed next to the evaporation sources 20, partially blocking a space formed between the substrate 12 and the evaporation sources 20.

Figure 3:
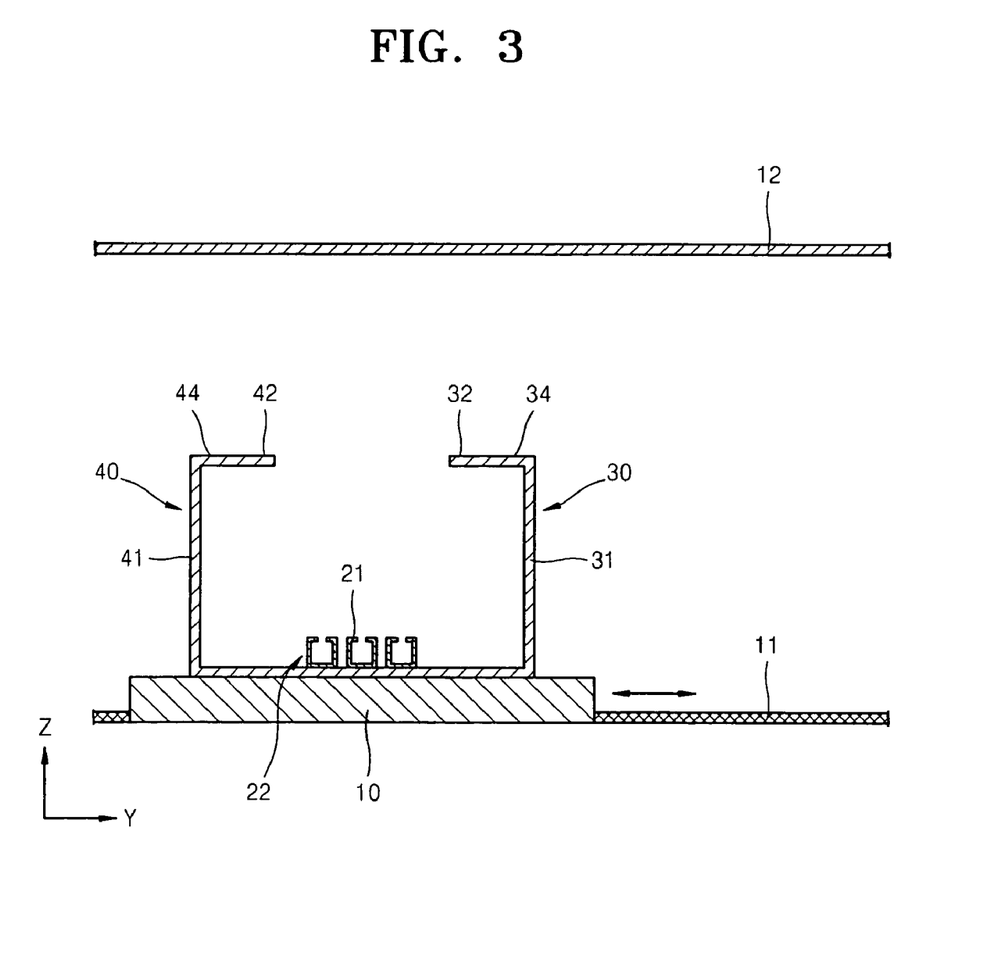
FIG. 3 is a cross-sectional view of the evaporation apparatus of FIG. 1, taken along line III-III of FIG. 2, according to an embodiment of the present invention.

FIG. 2 is a plan view of the evaporations sources 20 and the first and second compensation members 30 and 40 of the evaporations apparatus of FIG. 1, constructed as an embodiment of the present invention. FIG. 3 is a cross-sectional view of the evaporation apparatus of FIG. 1, taken along line III-III of FIG. 2, according to an embodiment of the present invention.

Referring to FIG. 2, the first compensation member 30 and the second compensation member 40 of the current embodiment of the present invention are separated from each other by a predetermined distance in the Y-axis direction, and the evaporation sources 20 are disposed between the first compensation member 30 and the second compensation member 40.

The first compensation member 30 and the second compensation member 40 respectively include first compensation plates 32 and 42 arranged at positions corresponding to (or closer to) the first evaporation source 22, and second compensation plates 33 and 43 arranged at positions corresponding to (or closer to) the second evaporation source 23. That is, the first compensation plate 32 of the first compensation member 30 and the first compensation plate 42 of the second compensation member 40 face each other. Also, the second compensation plate 33 of the first compensation member 30 and the second compensation plate 43 of the second compensation member 40 face each other. When viewed from the top as illustrated in FIG. 2, the first evaporation source 22 is disposed between the first compensation plate 32 of the first compensation member 30 and the first compensation plate 42 of the second compensation member 40, and the second evaporation source 23 is disposed between the second compensation plate 33 of the first compensation member 30 and the second compensation plate 43 of the second compensation member 40.

The first compensation member 30 and the second compensation member 40 respectively include support units 34 and 44 extending parallel to a direction from the first evaporation source 22 to the second evaporation source 23, that is, in an X-axis direction of FIG. 2. The first compensation plates 32 and 42 and the second compensation plates 33 and 43 respectively protrude beyond the support units 34 and 44 toward the first and second evaporation sources 22 and 23. Thus, in the first compensation member 30 and the second compensation member 40, the first compensation plates 32 and 42, the support units 34 and 44, and the second compensation plates 33 and 43, are arranged in a form of a wave.

As illustrated in FIG. 3, the first compensation plates 32 and 42 and the second compensation plates 33 and 43 protrude beyond the support units 34 and 44 in a manner that the plate surfaces of the first compensation plates 32 and 42 and the second compensation plates 33 and 43 are parallel to the first evaporation source 22 and the second evaporation source 23. In other words, the plate surface of the first compensation plates 32 and 42 are disposed substantially parallel to a top surface of the first evaporation source 22, and the second compensation plates 33 and 43 are disposed substantially parallel to a top surface of the second evaporation source 23.

The first compensation member 30 and the second compensation member 40 with the aforementioned structure are respectively connected to a first shielding wall 31 and a second shielding wall 41 which extend from the base 10. Referring to FIG. 3, the first shielding wall 31 and the second shielding wall 41 reduce an evaporation angle to a direction (the Y-axis direction) that is perpendicular to a direction (the X-axis direction) in which the first and second evaporation sources 22 and 23 are arranged. Thus, in the case where a mask is interposed between the substrate 12 and the evaporation sources 20, a shadow effect may be reduced.

Meanwhile, in the present invention, both of the first compensation member 30 and the second compensation member 40 may not be necessarily to achieve the goal of the present invention. In other words, only one compensation member can be included in the evaporation apparatus of the present invention.

Also, the first compensation plate 32 and the second compensation plate 33 of the first compensation member 30 may be disposed to be closer to each other. Protrusion positions of the first compensation plate 32 and the second compensation plate 33 may be disposed to be closer than positions located immediately above the first and second evaporation sources 22 and 23. Similarly, the first compensation plate 42 and the second compensation plate 43 of the second compensation member 40 may be disposed to be closer to each other. A distance between the first compensation plate 42 and the second compensation plate 43 is not required to be equal to a distance between the first compensation plate 32 and the second compensation plate 33. That is, the distance between the first compensation plate 42 and the second compensation plate 43 may be shorter or longer than the distance between the first compensation plate 32 and the second compensation plate 33.

The first compensation member 30 and the second compensation member 40 may be disposed to be closer to each other, such that the first compensation member 30 and the second compensation member 40 may be disposed immediately above outermost evaporation crucibles 21 of the first and second evaporation sources 22 and 23 which are linearly arranged, as illustrated in FIG. 2. Otherwise, the first compensation member 30 and the second compensation member 40 may be disposed to be further away from each other.

As described above, a desired dispersion angle of the first and second evaporation sources 22 and 23 may be adjusted by calibrating a distance between the first compensation plates 32 and 42, and a distance between the second compensation plates 33 and 43, or by calibrating a distance between the first compensation member 30 and the second compensation member 40, such that an appropriate design according to a feature of an evaporation material is possible.

In the evaporation apparatus according to the current embodiment of the present invention, the evaporation material is dispersed from the first and second evaporation sources 22 and 23 while the base 10 moves on the guide rails 11 in the Y-axis direction.

An evaporation amount according to the moving direction of the evaporation sources 20 is controlled by the first compensation member 30 and the second compensation member 40, and this control is performed by compensating the profile illustrated in FIG. 5, such that a uniform thin film may be formed.

Figure 4:
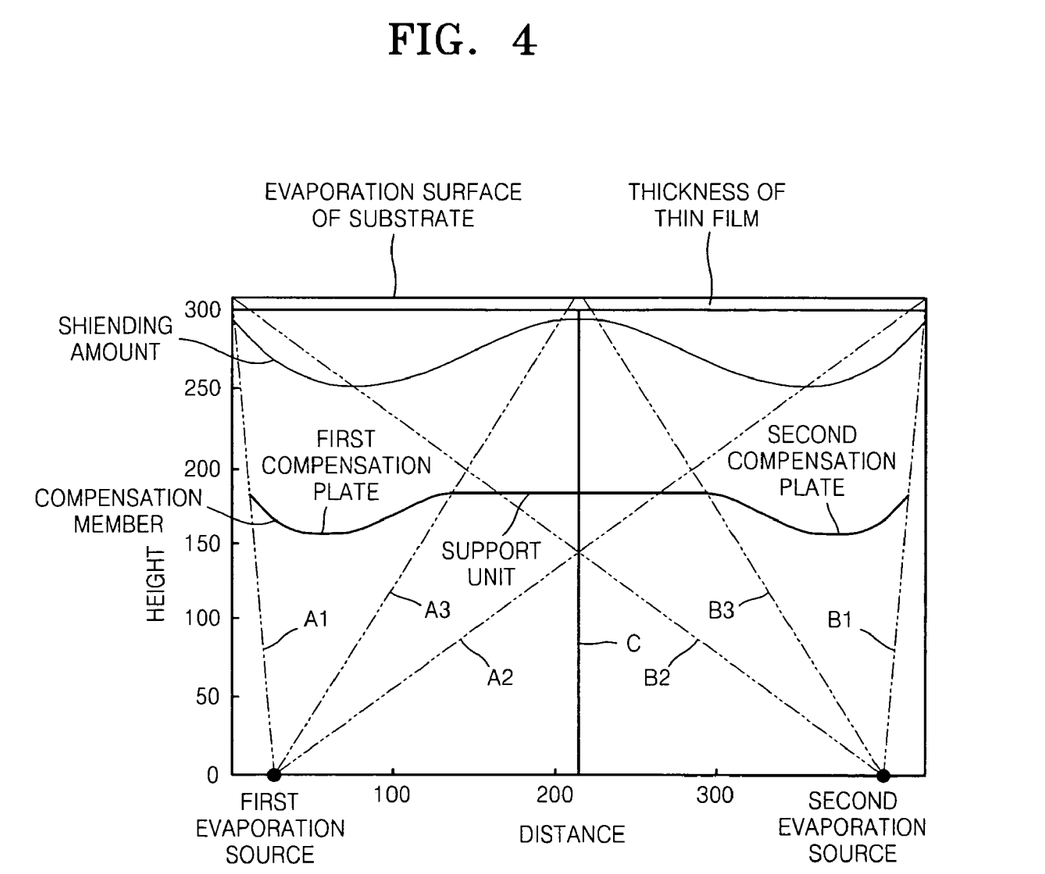
FIG. 4 is a drawing for illustrating a design concept of the compensation members in the evaporation apparatus of FIG. 1, according to an embodiment of the present invention.

FIG. 4 is a drawing for illustrating a design concept of the first compensation member 30 and the second compensation member 40, according to an embodiment of the present invention. An X-axis of the graph of FIG. 4 represents positions of a first evaporation source and a second evaporation source. A Y-axis of the graph represents a height from the first and second evaporation sources to an evaporation surface of a substrate.

Referring to FIG. 4, the first evaporation source and the second evaporation source emit an evaporation material toward the evaporation surface of the substrate such that the evaporation paths of the evaporation materials emitted by the first and e second evaporation sources overlap each other. The first evaporation source emits the evaporation material toward the evaporation surface of the substrate, covering an area between A1 and A2. The second evaporation source emits the evaporation material toward the evaporation surface of the substrate, covering an area between B1 and B2.

Meanwhile, referring to FIG. 4, the first evaporation source emits the evaporation material toward a half of the evaporation surface of the substrate, in which the first evaporation source is located, via an evaporation profile located between A1 and A3. Also, the second evaporation source emits the evaporation material toward the other half of the evaporation surface of the substrate, in which the second evaporation source is located, via an evaporation profile located between B1 and B3.

A first compensation plate is designed so as to be disposed within the evaporation profile located between A1 and A3 so that a shielding amount illustrated in FIG. 4 is achieved in the half of the substrate where the first evaporation source is located. A second compensation plate is designed so as to be placed within the evaporation profile located between B1 and B3 so that a shielding amount illustrated in FIG. 4 is achieved in the other half of the substrate where the second evaporation source is located. As illustrated in FIG. 4, a shielding amount via a support unit located between the first compensation plate and the second compensation plate is less than the shielding amount of the first compensation plate and the second compensation plate. Therefore, a thickness of a thin film may be formed to be uniform.

A design for a first compensation member and a second compensation member is not necessarily limited so as to achieve the shielding amount illustrated in FIG. 4, but may vary according to the features of the evaporation material, such as dispersion speed, mass, density, film compactness based on such features, film thickness uniformity, and the like. For example, as described above, the distance between the first compensation plate 32 and the second compensation plate 33 of the first compensation member 30, the distance between the first compensation plate 42 and the second compensation plate 43 of the second compensation member 40, or the distance between the first compensation member 30 and the second compensation member 40 may vary. Also, an installation height of each of the first compensation member 30 and the second compensation member 40 may vary.

Accordingly, the evaporation material dispersed from the second evaporation source 23 may be partly shielded by the first compensation plates 32 and 42, and the evaporation material dispersed from the first evaporation source 22 may be partly shielded by the second compensation plates 33 and 43. Thus, according to a design condition, the shielding amount of the evaporation material may be variously controlled.

Meanwhile, the support units 34 and 44, respectively located between the first compensation plate 32 and the second compensation plate 33, and between the first compensation plate 42 and the second compensation plate 43, shield the evaporation material dispersed from the first and second evaporation sources 22 and 23, with a steep angle greater than a predetermined angle, thereby reducing a shadowing effect. That is, the support units 34 and 44 may also serve as an angle control plate.

Hereinafter, a thin film forming method using the evaporation apparatus illustrated in FIGS. 1 to 3 will be described, according to an embodiment of the present invention.

Referring to FIGS. 1 through 3, the first evaporation source 22 and the second evaporation source 23, which are separated from each other in a chamber, are arranged.

Then, the substrate 12 is disposed so as to face the first and second evaporation sources 22 and 23.

When a predetermined vacuum or an inactive atmosphere is maintained inside the chamber, the first and second evaporation sources 22 and 23 are driven so as to emit an evaporation material toward the substrate 12, while the base 10 is moving in a moving direction along a Y-axis.

At this time, a space which corresponds to a position of the first evaporation source 22, is shielded by the first compensation plates 32 and 42 which are respectively located at the side of and at the opposite side of the moving direction of the first evaporation source 22. Thus, an amount of the evaporation material dispersed from the first evaporation source 22 is partly shielded, as illustrated in FIG. 4.

Similarly, a space which corresponds to a position of the second evaporation source 23, is shielded by the second compensation plates 33 and 43 which are respectively located at the side of and at the opposite side of the moving direction of the second evaporation source 23. Thus, an amount of the evaporation material dispersed from the second evaporation source 23 is also partly shielded, as illustrated in FIG. 4.

The amount of the evaporation material shielded in a position corresponding to the space between the first evaporation source 22 and the second evaporation source 23 is less than that the amount of the evaporation material shielded in positions respectively corresponding to the first and second evaporation sources 22 and 23, as illustrated in FIG. 4.

Accordingly, a film may be formed to have a uniform thickness. The film may be formed to have a desired thickness by a reciprocating movement of the base 10 in the Y-axis direction.

According to the present invention, the thickness of an evaporated film can be formed to be uniform even when an evaporation source for a large substrate is employed. Also, the evaporation apparatus of the present invention can be easily employed with different sized substrates.

While this invention has been particularly shown and described with reference to exemplary embodiments thereof, it will be understood by those of ordinary skill in the art that various changes in form and details may be made therein without departing from the spirit and scope of the invention as defined by the appended claims. The exemplary embodiments should be considered in a descriptive sense only and not for purposes of limitation. Therefore, the scope of the invention is defined not by the detailed description of the invention but by the appended claims, and all differences within the scope will be construed as being included in the present invention.

What is claimed is:

1. An evaporation apparatus comprising:
    a first evaporation source;
    a second evaporation source being separated from the first evaporation source, the first and second evaporation sources being capable of simultaneously moving in a moving direction; and
    a compensation member disposed in a space formed between a substrate and the first and second evaporation sources, the compensation member being capable of moving in the moving direction simultaneously with the first and second evaporation sources, the compensation member comprising:
        a first compensation plate disposed in a position closer to the first evaporation source than the second evaporation source;
        a second compensation plate disposed in a position closer to the second evaporation source than the first evaporation source; and
        a support unit connecting the first compensation plate to the second compensation plate, none of the first and second compensation plates and the support unit covering a line imaginarily connecting the first evaporation source to the second evaporation source.

2. The evaporation apparatus of claim 1, wherein the first compensation plate protrudes from the support unit towards a line that is imaginarily drawn from the first evaporation source perpendicularly to the substrate, the second compensation plate protruding from the support unit towards a line that is imaginarily drawn from the second evaporation source perpendicularly to the substrate.

3. The evaporation apparatus of claim 1, wherein each of the first compensation plate and the second compensation plate is parallel to a surface of the substrate facing the first evaporation source and the second evaporation source.

4. The evaporation apparatus of claim 1, wherein the first evaporation source and the second evaporation source perform a reciprocating linear movement.

5. The evaporation apparatus of claim 1, wherein the second evaporation source is separated from the first evaporation source in a direction substantially perpendicular to the moving direction.

6. A method for forming a thin film, comprising;
    arranging a first evaporation source and a second evaporation source that is separated from the first evaporation source, the first and second evaporation sources being capable of simultaneously moving in a moving direction;
    placing substrate to face the first and second evaporation sources;
    partially shielding a space formed between a substrate and the first and second evaporation sources by disposing a compensation member in the space formed between the substrate and the first and second evaporation sources, the compensation member being capable of moving in the moving direction simultaneously with the first and second evaporation sources, the compensation member comprising:
        a first compensation plate disposed in a position closer to the first evaporation source than the second evaporation source;
        a second compensation plate disposed in a position closer to the second evaporation source than the first evaporation source; and
        a support unit connecting the first compensation plate to the second compensation plate, none of the first and second compensation plates and the support unit covering a line imaginarily connecting the first evaporation source to the second evaporation source;
    and forming a thin film on the substrate while simultaneously moving the first and second evaporation sources in the moving direction.

7. The method of claim 6, wherein an amount of an evaporation material shielded by the first compensation plate or the second compensation plate is greater than an amount of an evaporation material shielded by the support unit.

8. The method of claim 6, wherein partially shielding the space formed between the substrate and the first and second evaporation sources comprising:

placing the first compensation plate in a first space formed between the substrate and the first evaporation source; and placing the second compensation plate in a second space formed between the substrate and the second evaporation source.

9. The method of claim 8, wherein the step of forming the thin film includes a step of forming a thin film on the substrate while reciprocating the first and second evaporation sources simultaneously with the first and second compensation plates.

10. The method of claim 6, wherein the first and second evaporation sources are separated in a direction substantially perpendicular to the moving direction.

* * * * *